United States Patent [19]

Kolev

[11] Patent Number: 6,057,701
[45] Date of Patent: May 2, 2000

[54] CONSTANT RESISTANCE DEEP LEVEL TRANSIENT SPECTROSCOPY (CR-DLTS) SYSTEM AND METHOD, AVERGING METHODS FOR DLTS, AND APPARATUS FOR CARRYING OUT THE METHODS

[76] Inventor: Plamen Vassilev Kolev, #211-2200 Dundas St., Vancouver, Canada, V5L 1J8

[21] Appl. No.: 09/048,207

[22] Filed: Mar. 26, 1998

[51] Int. Cl.$^7$ .................................................. G01R 31/26
[52] U.S. Cl. ...................... 324/769; 324/767; 324/158.1
[58] Field of Search .................. 324/769, 662, 324/689, 765, 458, 663, 671, 767

[56] References Cited

U.S. PATENT DOCUMENTS

| | | |
|---|---|---|
| 3,859,595 | 1/1975 | Lang . |
| 3,937,943 | 2/1976 | Debrunner . |
| 4,137,568 | 1/1979 | Dlugos . |
| 4,437,060 | 3/1984 | Ferenczi et al. ...................... 324/767 |
| 4,571,541 | 2/1986 | Ferenczi . |
| 5,521,839 | 5/1996 | Doolittle . |
| 5,523,700 | 6/1996 | Williams . |

OTHER PUBLICATIONS

P. V. Kolev et al., "Averaging and Recording of Digital DLTS Transient Signals," accepted in Review of Scientific Instruments (Spring 1998).

*Primary Examiner*—Josie Ballato
*Assistant Examiner*—Minh Tang

[57] ABSTRACT

A system, methods and apparatus for determining the properties of electrically active imperfections in semiconductor materials by Deep Level Transient Spectroscopy (DLTS) are disclosed. Source-drain resistance of a field-effect transistor (FET) is compared with a reference resistor and the difference is applied through a feedback circuit to the gate. The obtained voltage transient compensates for the threshold voltage changes resulting from the emission of charges trapped by the imperfections during pulses applied to the gate and alternating with the action of the feedback circuit. Knowledge of the free charge carrier mobility is not necessary, and the intensity of the DLTS signal and the sensitivity of the measurement are area independent. Thereof, the method is advantageous for measurement of deep submicron FETs. In the disclosed system, the DLTS signal is digitized and numerically processed by a combination of two averaging and data reduction methods that offers advantageous signal to noise ratio and convenience for use comparable to these usually found in analog DLTS systems, whereas the transient analysis can be executed by advantageous numerical analytical techniques. By utilizing the disclosed combination of numerical processing methods, a DLTS signal substantially free from noise can be displayed and the expected exponential behavior of the transient decay can be verified immediately. This combination of numerical processing methods is not limited to the disclosed system and can be employed in many other DLTS methods or in other experiments requiring analyses of transient data.

17 Claims, 8 Drawing Sheets

CONSTANT RESISTANCE DEEP LEVEL TRANSIENT SPECTROSCOPY (CR-DLTS) SYSTEM AND METHOD, AVERGING METHODS FOR DLTS, AND APPARATUS FOR CARRYING OUT THE METHODS

FIELD OF THE INVENTION

The present invention relates to a method for determining properties of electrically active imperfections in semiconductor materials known in the art as deep-level transient spectroscopy (DLTS). More particularly, this invention relates to a method to make DLTS analyses on a field-effect transistor build in semiconductor material, and numerical averaging methods to process DLTS signals.

The invention relates also to an apparatus for carrying out the methods.

BACKGROUND OF THE INVENTION

It is known in the art that certain structural defects or impurities (imperfections) can trap either electrons or holes. These imperfections, or traps, give rise to localized energy levels which lie relatively deep in the forbidden energy bandgap of the semiconductor crystal as compared with the relatively shallow levels raised by other impurities, such as donors and acceptors. A method called deep-level transient spectroscopy, or in short as DLTS method, disclosed by Lang in U.S. Pat. No. 3,859,595 and a large number of modifications of this method, as described by, for example, D. K. Schroder in Chapter 7 of "Semiconductor Material and Device Characterization," (Wiley-Interscience, New York, 1990), have been widely accepted in the art as the most accurate and sensitive methods for determining properties of these traps. In these methods, the localized traps are periodically filled with charge and emptied, and the properties of the traps are determined by analyzing the transient of some electrical property of a test structure built in the semiconductor material which transient is related to the emission of charge from the traps as the test structure restores its thermodynamical equilibrium.

In the original Lang's method, the trap properties are determined from changes in the capacitance transient of a reverse biased diode with variation of its temperature. These changes are measured by utilizing a double boxcar integrator. It is known in the art of DLTS that the trap properties can be also obtained from current, charge or voltage transients, and by utilizing for data processing other analog instruments, such as look-in amplifier or exponential (Miller) correlator. Major advantage of the analog methods for data processing is a very high signal to noise ratio (SNR) that can be obtained. Major disadvantage is the necessity to repeat the measurement in the full range of temperature variation several times with different settings of the emission rate window.

Other means for processing of the DLTS signals are numerical transient analysis methods, which are utilized after the transient signal is converted in a plurality of data points by utilizing a digitizing mechanism. This plurality of data points is recorded at a multiplicity of temperatures and only one measurement in the desired range of temperature variation suffices to determine the trap properties. Major disadvantage of the numerical data processing of DLTS transients is a reduced SNR as compared to data processing utilizing analog instruments. Another disadvantage of the numerical methods is data redundancy as discussed in for example, U.S. Pat. No. 5,521,839 to Doolittle et al. Therein, the inventors have disclosed a pseudo-logarithmic storage scheme for manipulating numerical data resulting from digitizing of capacitance or conductance DLTS transients as a means for solution of the data redundancy problem. Notwithstanding, the problem of reduced SNR in the numerical DLTS data processing remains unaddressed. For further discussions in regard to the advantages and disadvantages of utilizing analog or numerical data manipulation of DLTS transients see also P. Kolev et al., "Averaging and Recording of Digital DLTS Transient Signals," (accepted for publication in Review of Scientific Instruments, Spring 1998). Other known method for manipulating numerical transient data resulting from kinetic action in physical experiments is disclosed in U.S. Pat. No. 3,937,943 to Debrunner et al. which is advantageous to the pseudo-logarithmic storage scheme disclosed in the aforementioned U.S. Pat. No. 5,521,839. Another circuit which can be incorporated in the apparatus for performing pseudo-logarithmic time averaging is disclosed in U.S. Pat. No. 4,137,568 to Dlugos. Other known methods for numerical averaging of periodic signals are discussed by T. H. Wilmshurst in Chapter 2, "Signal Recovery from Noise in Electronic Instrumentation," Second Edition, (IOP Publishing, Bristol, England, 1990). For the preferred embodiment in this Patent, continuous time averaging is utilized as explained on page 27 of the aforementioned book. For further discussions in regard to the DLTS methods, see the aforementioned Chapter 7 by D. K. Schroder, and U.S. Pat. No. 4,571,541 to Ferenczi et al.

It is known in the art of DLTS, that measurements of voltage transients are easier to analyze for the reason that the volume of the region near a rectifying junction depleted from free charge carriers, or in short the space charge region, remains constant as the traps emit their charge. A well known DLTS method to obtain voltage transients is to maintain the capacitance of the test structure constant utilizing a capacitance sensor and a feedback circuit, as revealed by, for example, R. Y. DeJule et al., "Constant Capacitance DLTS Circuit for Measuring High Purity Semiconductors," Solid-State Electronics, Vol. 28, page 639 (June 1985). For previous art and for state of the art of constructing the feedback circuit used in this method see J. J. Shiau et al., "A Method to Improve the Speed and Sensitivity of Constant-Capacitance Voltage Transient Measurements," Solid-State Electronics, Vol. 30, page 513 (May 1987) and P. Kolev, "An Improved Feedback Circuit for Constant-Capacitance Voltage Transient Measurements," Solid-State Electronics, Vol. 35, page 387 (March 1992). The advantages of maintaining a constant capacitance, and thereof a constant width of a depleted space charge region within the device under test during measurements of semiconductor devices are also known in other method for measurement of semiconductor materials disclosed in U.S. Pat. No. 5,523,700 to Williams et al.

Field-effect transistors, or in short FETs, are known to be the principal devices in the electronic manufacturing. With the shrinkage of the FETs to submicron size, standard DLTS methods which analyzes capacitance transients become impractical and measurements of current or conductance (inverse of resistance) transients are more convenient. Disadvantage of these methods is the necessity to determine the mobility of the free charge carriers in the FET for the entire range of temperatures utilized for DLTS measurements. A new method advantageously to carry out DLTS measurements of submicron scale FETs without the need to determine the mobility of the free charge carriers was revealed by P. Kolev et al., "Constant-Resistance Deep-Level Transient Spectroscopy in Submicron Metal-Oxide-Semiconductor Field-Effect Transistors," Journal of Applied Physics, Vol. 83, page 820 (January 1998). This method analyses the voltage transients utilized for compensation of the changes in the threshold or pinch-off voltage as the traps emit the trapped charge. These voltage transients are obtained from an apparatus that maintains constant resistance between the source and drain of the FET under test. Thereof, the method is named as constant-resistance DLTS, or in short CR-DLTS. Similarly to the constant-capacitance DLTS, or in short the CC-DLTS method, the new method maintains a constant volume of the space charge region, whereas CR-DLTS is based on different physical mechanism as compared to the CC-DLTS.

The principal objective of the present invention is to provide means for improved measurement of traps in the body or on the active surface of field-effect transistors. Another objective of the present invention is to provide means for numerical manipulation of digitized DLTS transients by which an increased signal to noise ratio and higher sensitivity can be obtained with respect to the numerical manipulations utilized heretofore in DLTS systems. A further objective of the present invention is to disclose comparatively simple apparatus for carrying out these methods.

SUMMARY OF THE INVENTION

The present invention is a system and method for DLTS analysis of field-effect transistors and a combination of methods for numerical manipulation of DLTS transients. In the context of this document, in the aspect of numerical manipulation, "DLTS transient" refers to not only voltage transient, but also to capacitance, current or charge transients in DLTS experiments. In the aspect of the field-effect transistor as an object of the DLTS measurement, "field-effect transistor" means not only enhancement or depletion mode metal-oxide-semiconductor FET, but also silicon on insulator (SOI, SIMOX), silicon on sapphire (SOS), p-n junction FET (JFET), metal-semiconductor FET (MESFET) or any other transistor controlled by the field-effect and characterized by a specific parameter, known as a threshold or pinch-off voltage, that can be changed by the emission of charge from traps localized in the field-effect controlled part of the transistor.

According to the present invention, the novel DLTS system which utilizes also a new combination of methods for numerical manipulation of transient signals comprises a temperature controller, a conductance sensor, a reference resistor, a feedback mechanism, a voltage source, a pulse generator, a digitizing mechanism, an apparatus for performing pseudo-logarithmic numerical averaging and for storing the obtained results directly into the memory of a personal computer, and a personal computer. Briefly described, the system performs the DLTS measurement as follows.

As will be described in more detail later, the feedback mechanism in conjointment with the conductance sensor produces a voltage transient which is directly proportional to the charge emitted from the traps in the field-effect controlled part of the transistor. This voltage transient is converted into a plurality of sampling points which are further numerically manipulated by a pseudo-logarithmic time averaging mechanism. This mechanism produces a new plurality of data points, each data point representing an averaged value of the plurality of sampling points that are contained in time intervals increasing by the power of two after a preselected number of performed averaging operations, or in other words, after a preselected number of data points. This new plurality of data points is transferred directly into the memory of a personal computer. Therein, a second averaging operation is performed by a computer program as each data point is averaged with the corresponding data points obtained from previously recorded transients in accordance with the aforementioned continuous time averaging method. A new plurality of data points results from this second averaging operation and this new plurality is stored in another location of the computer memory. Hereafter, the result representing the transient can be retrieved from this second location of the computer memory and is available for display and analysis after each sampled transient. Moreover, it is not necessary the computer program execution to be synchronized with the pulses which are filling the traps with charge as disclosed in U.S. Pat. No. 5,521,839.

Important feature of the present invention is the fact that the intensity of the voltage transient and the sensitivity of the measurement are not dependent on the gate area of the FET under test. Another important feature is that the sensitivity is proportional to the ratio of the channel length to the channel width, whereas in the constant-capacitance DLTS the sensitivity is proportional to the area of the test structure.

Another important feature of the present invention is the ability of the feedback mechanism to cease the operation in feedback mode during the trap filling pulse and quickly to restore feedback operation mode during the emission pulse.

In another aspect of the present invention, a new combination of two numerical averaging techniques, heretofore not utilized for manipulation of digitized DLTS transients is disclosed, which increases substantially the signal to noise ratio and the sensitivity of the measurement. Another important feature of the present invention is the ability of the novel system continuously to display the DLTS transient on the computer screen, to validate the exponential nature of the transient, and to determine immediately the characteristic time constant of the DLTS transient.

Additional objects and features of the present invention will become apparent to one of skill in the art from the following detailed description and accompanying drawings.

BRIEF DESCRIPTION OF THE DRAWINGS

Details of a preferred embodiment of the present invention, comparatively simple apparatus, and the best mode presently contemplated for carrying out the invention can be better understood from the detailed description with reference to the following drawings wherein.

DETAILED DESCRIPTION

Figure 1:
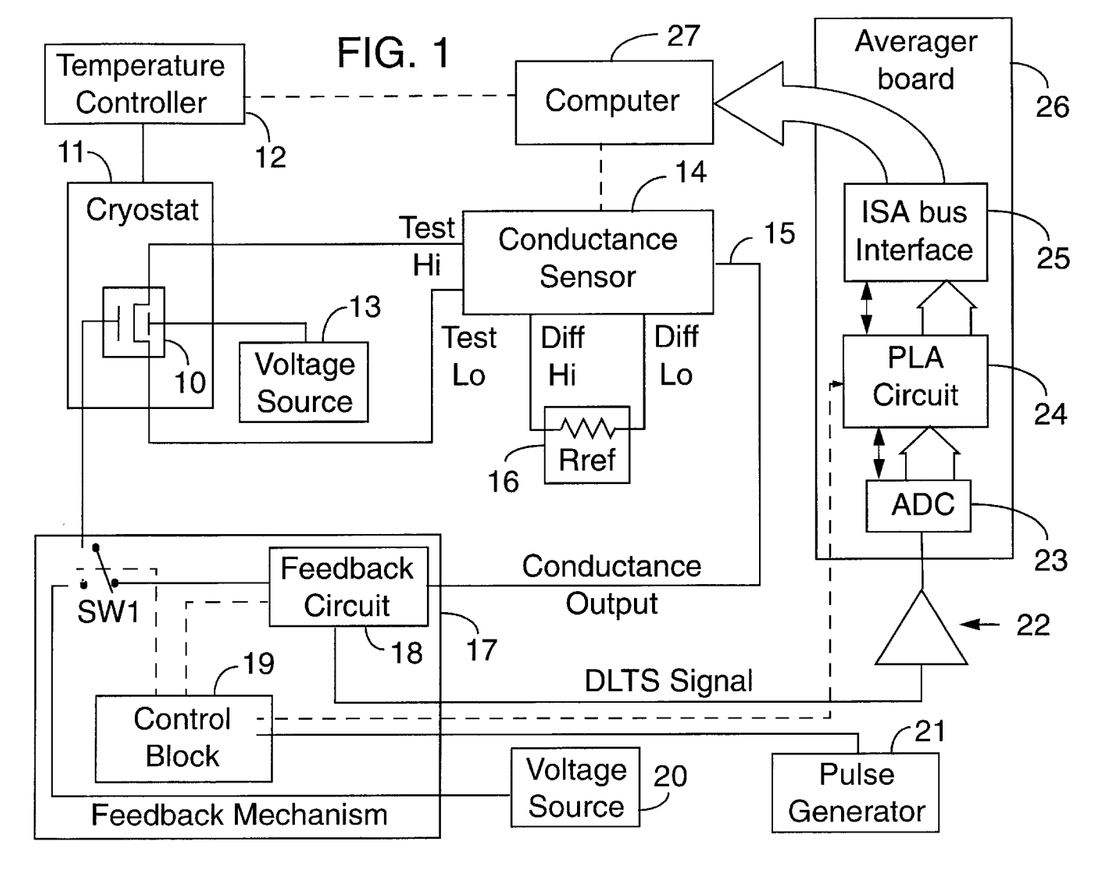
FIG. 1 is a functional block diagram of the preferred embodiment of the claimed DLTS system.

As indicated in FIG. 1, FET to be tested 10 is placed in a cryostat 11. The temperature of the FET 10 can be varied by a temperature controller 12. For FETs provided with a separate terminal for biasing of the substrate, a voltage source 13 can be connected to this terminal. In the preferred embodiment, the temperature controller 12, the voltage sources 13 and 20, the pulse generator 21, and the amplifier 22 are controlled by the computer 27 by the means of IEEE-488 bus line which is a standard for measuring instruments in the art and provides a full automation for performing a plurality of measurements. Source and drain terminals of the FET 10 are connected to the test terminals of the conductance sensor 14. A reference resistor 16 is connected to the differential terminals of the sensor 14. An analog signal proportional to the difference between the source-drain conductance of the FET 10 and the conductance of the reference resistor 16 is obtained from the conductance output 15 of the sensor 14. This analog signal is applied to a feedback mechanism 17, more specifically to the input of a feedback circuit 18.

Figure 2:
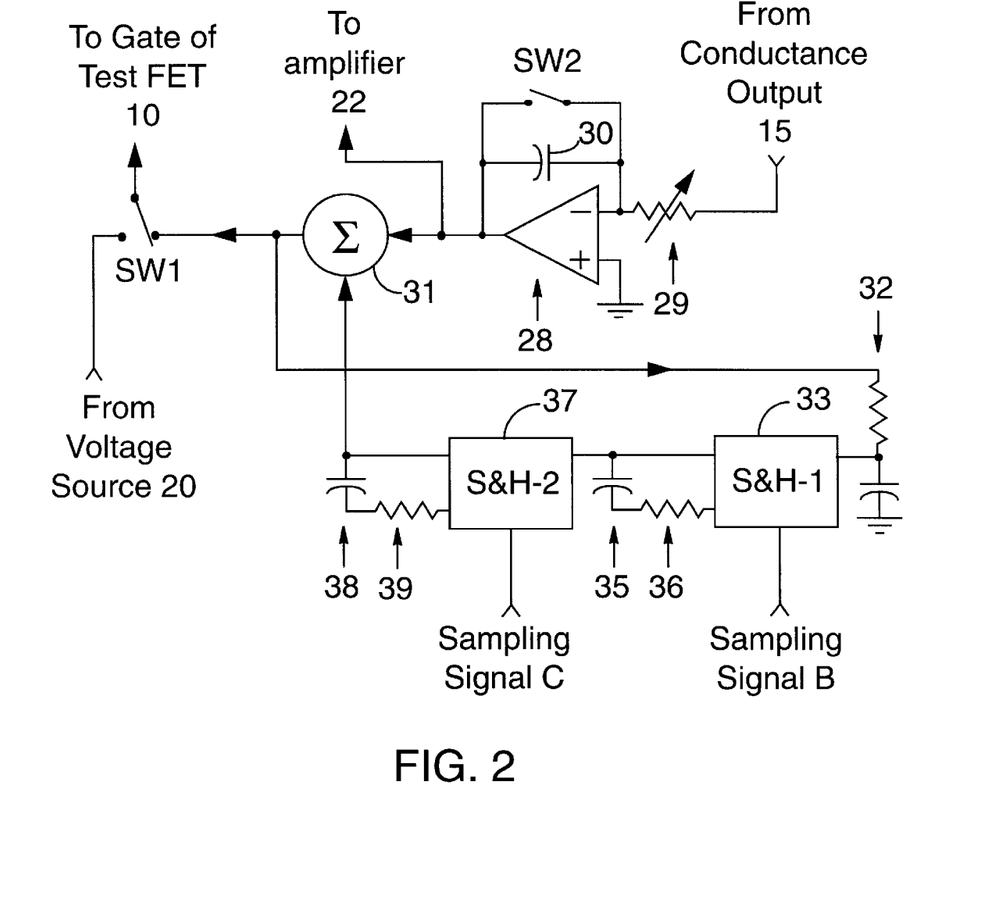
FIG. 2 is detailed block diagram of the feedback circuit utilized in the feedback mechanism.

Referring now to FIG. 2, the feedback circuit 18 comprises an integrator, a memory circuit and a summing circuit 31. The integrator comprises an operational amplifier 28, a variable resistor 29, an integrating capacitor 30, and a clamping switch SW2, preferably a solid-state analog switch. The time constant of this integrator can be adjusted by varying the resistor 29 or/and by connecting one of a plurality of capacitors (not shown in FIG. 2) in place of the capacitor 30. In the best mode of operation, the time constant of the integrator is advantageously adjusted to a minimum value that is sufficient to prevent the oscillations in the feedback loop consisting of the FET 10, the conductance sensor 14 and the feedback circuit 18. This minimum value is specific and depends on the gain of the FET to be tested 10. The signal from the output of the integrator is applied to the summing circuit 31. In the art are known many variations of summing circuits and a high precision instrumentation circuit is utilized in the preferred embodiment. The memory circuit comprises two sample and hold amplifiers 33 and 37, preferably with low hold leakage currents. This memory circuit is connected as a local feedback circuit to the summing circuit 31 and is utilized to store the output voltage from the feedback circuit 18 shortly before the end of the DLTS transient, and to apply this voltage as a baseline for the next transient.

The output signal of the summing circuit 31 is fed through a low-pass RC filter 32 to the input of the memory circuit, more specifically to the input of the sample and hold amplifier 33. Low-leakage, large value storage capacitors 35 and 38 are utilized in the preferred embodiment and the acquisition times of the sample and hold amplifiers 33 and 37 are further advantageously increased by adding resistors 36 and 39 in series with the storage capacitors 35 and 38 correspondingly. Sample and hold amplifier 33 is controlled by a signal B to sample for a short time before the end of the emission pulse. Sample and hold amplifier 37 is controlled by a signal C to sample for a short time before the end of the filling pulse. These signals are provided by a circuit indicated in FIG. 1 as a control block 19.

Figure 3:
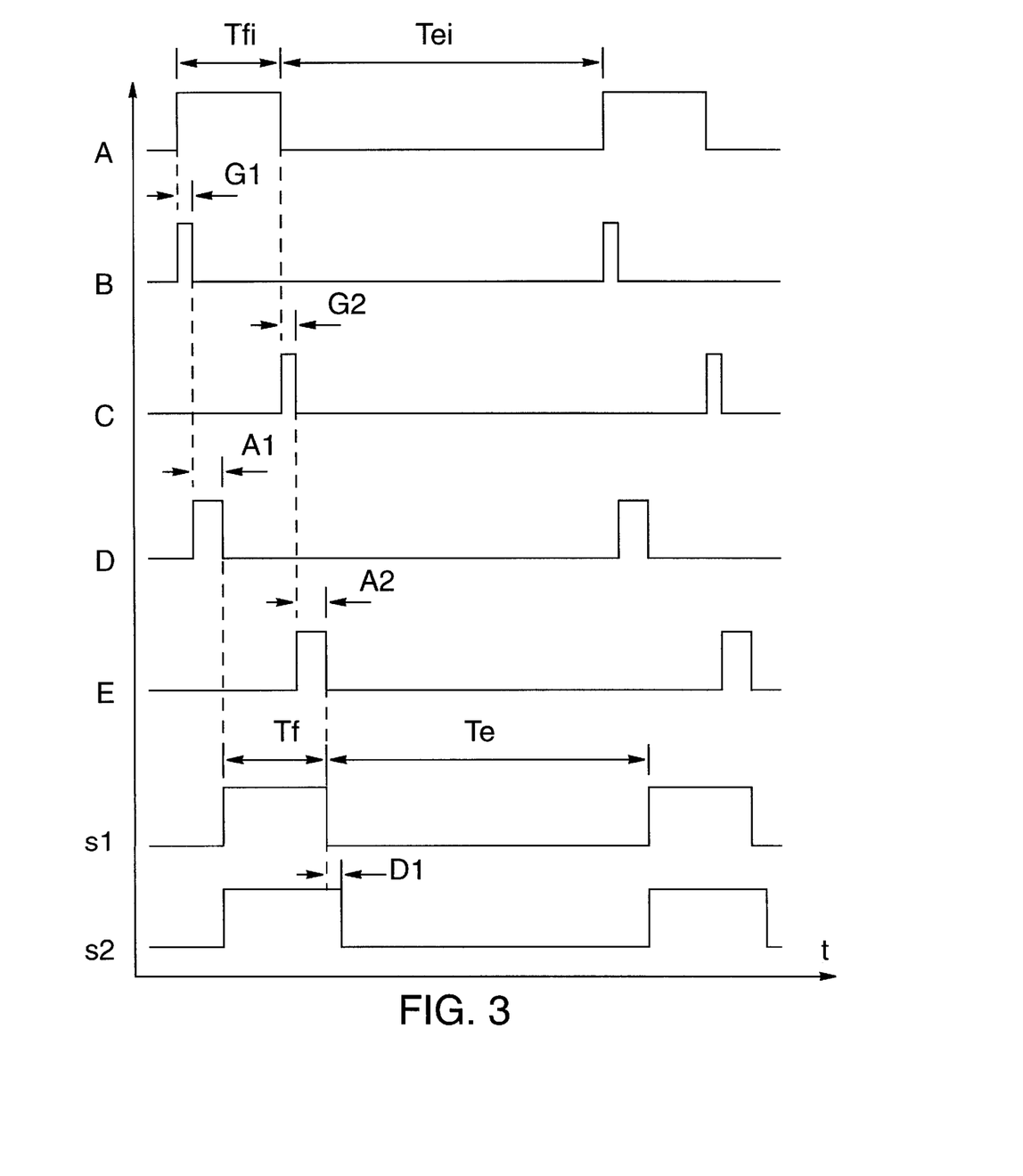
FIG. 3 shows the driving signal from the pulse generator and the waveforms of the signals produced from this signal by the control block of the feedback mechanism.

In the present embodiment, the electrical circuit of 19 is utilizing monostable multivibrators, or in short one-shot circuits. FIG. 3 illustrates the waveforms of the signals produced by the control block 19. The incoming signal A is obtained from the pulse generator 21. The incoming filling pulses are indicated as Tfi and the incoming emission pulses are indicated as Tei. The signal B consists of a plurality of acquisition pulses G1 obtained from an one-shot circuit triggered by the beginning of Tfi pulses. During the pulses G1, sample and hold amplifier 33 is acquiring voltage from the low-pass filter 32 and is accumulating this voltage into the storage capacitor 35. The signal C consists of a plurality of acquisition pulses G2 obtained from an one-shot circuit triggered by the beginning of Tei pulses. During the pulses G2, sample and hold amplifier 37 is acquiring the voltage stored in the capacitor 35 and is accumulating this voltage in the capacitor 38. The voltage stored in the capacitor 38 is applied to the second input of the su consisting of a plurality of pulses A1 defining the advance of G1 from the end of the emission pulse Te that is part of the signal s1 in FIG. 3. The falling edges of the G2 pulses in the signal C are triggering another one-shot circuit which produces a signal E consisting of a plurality of pulses A2 defining the advance of G2 from the end of the filling pulse Tf in the signal s1. The signal s1 is produced from the signals D and E and is identical to the input signal A, except that s1 is delayed in respect to the signal A. This secondary signal s1 is designated to serve as a main signal for synchronization in the DLTS system. The signal s1 drives an analog switch SW1 and triggers the capturing of the DLTS transients by the data acquisition and digital signal processing board 26 as indicated in FIG. 1. Another one-shot circuit produces a delay D1 in turning-off the clamping switch SW2. Thereof, the transition process in the conductance sensor at the beginning of the emission pulse can be eliminated.

This method of producing a secondary, delayed signal s1 from the original signal A and utilizing s1 for synchronization of the system allows the frequency and the duty ratio of the original signal A obtained from the pulse generator 21 to be varied in wide ranges whereas the widths of the acquisition pulses G1 and G2 and the advances before expiration of the filling and the emission pulses A1 and A2 remain constant.

It is known in the art, that feedback circuits with analog memories were utilized heretofore in constant capacitance DLTS measurement for separation of fast transients related to the motion of the free current carriers from the slow transients related to charge emission from the traps. This separation allowed to prevent the integration of the voltage step from the filling to the emission pulse and thereof to avoid distortion of the DLTS transient.

The new component in the feedback mechanism 17 disclosed herein is the switch SW1. During the trap filling pulses Tf, SW1 applies an advantageous voltage from the voltage source 20 directly to the gate of the FET to be tested 10. Therefrom, the traps in this part of the FET which is controlled by the gate are filled with charge. During the charge emission pulses Te, SW1 connects the output of the feedback circuit 18 to the gate of the FET 10. In accordance with the invention, the conductance sensor 14 detects the difference between the channel conductance of the FET 10 and the conductance of the reference resistor 16. The feedback circuit 18 provides advantageously a voltage which, whereas applied to the gate terminal of the FET 10, accurately offsets the aforementioned difference for the reason that the conductance sensor 14 and the feedback circuit 18 have a very large gain. The charge emitted from the aforementioned traps causes a transient in the voltage which is applied to the gate of the FET 10 for the reason that to compensate for the change in the threshold or pinch-off voltage and to maintain the source-drain conductance of the FET 10 equal to that of the reference resistor 16.

The analog memory comprising sample and hold amplifiers 33 and 37 has also a new function—to produce an advantageous initial voltage at the beginning of the DLTS transient and to prevent saturation of the integrator circuit during the filling pulse. The summing amplifier 31 advantageously separates the DLTS transient component from the DC level at the end of the transient, or in other words from the DC baseline. The DLTS transient obtained from the integrator circuit is combined by the summing circuit 31 with the DC baseline provided by the memory circuit and the result is applied to the gate of the FET to be tested 10. The DLTS transient without a DC baseline is obtained from the integrator circuit and is fed to an amplifier 22. After advantageous magnification and filtering, the DLTS transient is applied to a digitizing mechanism 23. In the preferred embodiment this mechanism is a 12-bit analog-to-digital converter (ADC).

During the filling pulses, the operation of the digitizing mechanism is ceased by the pseudo-logarithmic averager 24. When the signal s1 indicates the beginning of a DLTS transient, the averager 24 sends start-of-conversion pulses to the digitizing mechanism 23. Each aforesaid pulse initiates a digitizing operation in the ADC 23 and when this operation is completed, it results in a 12-bit binary number, or in other words a sampling point, and a signal for completed digitizing operation known as end-of-conversion (EOC) signal. These two signals are the input data and control signals for the pseudo-logarithmic averager 24. This pseudo-logarithmic averager 24 is easy to construct to one of skills in the art.

Figure 4:
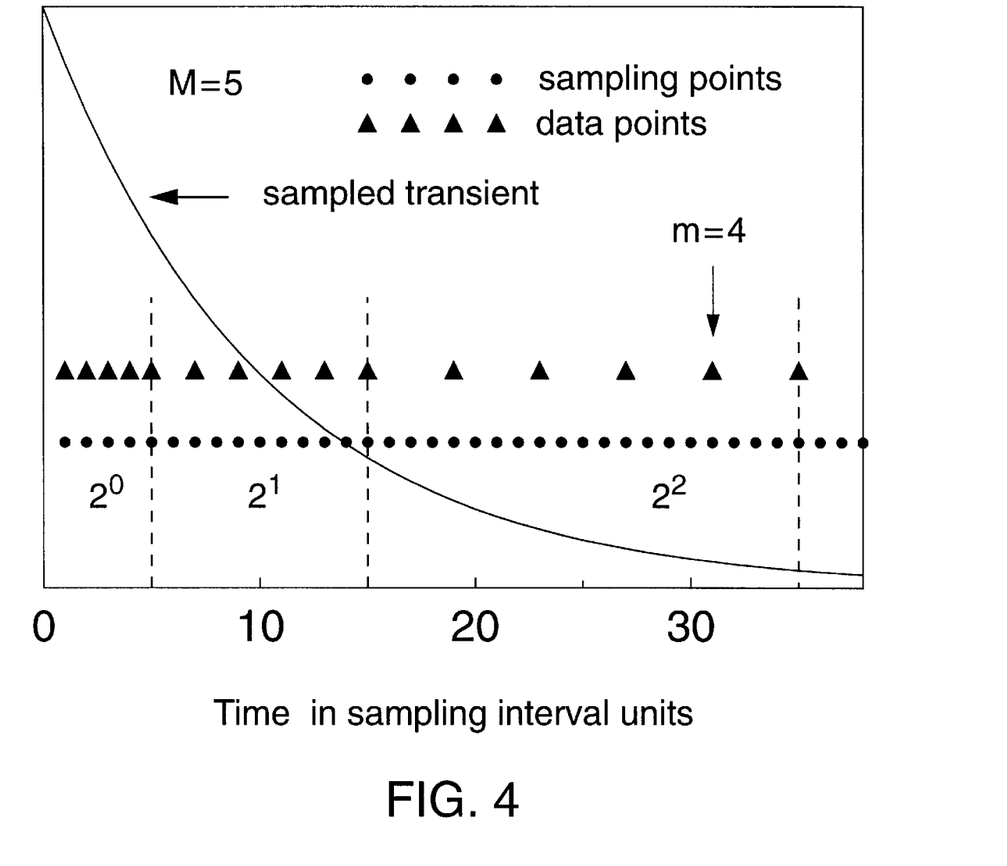
FIG. 4 illustrates the pseudo-logarithmic time averaging method by showing a sampled transient, sampling points obtained from a digitizing mechanism and data points obtained by averaging of the sampling points.

The essence of pseudo-logarithmic time averaging is to process the plurality of sampling points obtained by the digitizing mechanism 23 and to produce a plurality of data points, each data point representing an averaged value of the plurality of sampling points that are contained in time intervals increasing by the power of two after a preselected number of performed averaging operations, or in other words, after a preselected number of data points. Thereof, at the beginning of the transient each sampling point is converted into a data point, as illustrated in FIG. 4. After M conversions resulting M data points, the pseudo-logarithmic averager 24 doubles the length of the averaging interval and each data point is a mean arithmetic value from two consecutive sampling points. In FIG. 4, the number M is set to 5 but in the preferred embodiment M can be set to any number from one to 16. The best mode of operation is to set M=10 or M=16 depending from the signal to noise ratio of the DLTS transient to be averaged. The second averaging operation is repeated M times resulting another series of M data points and the pseudo-logarithmic averager 24 doubles again the length of the averaging time interval. Now, each data point is a mean arithmetic value from four consecutive sampling points. In the preferred embodiment this doubling of the length of the averaging time interval can be repeated 12 times. Thereof, the last M data points are averages of $2^{12}$ or 4096 sampling points. It is known in the art that the signal to noise ratio (SNR) improves as a square root from the number of the averaged samples. Herein, the expected SNR improvement is 64 times, but only for noise frequencies with period shorter than the averaging time interval which corresponds to the data point. Obviously, the lower limit of noise frequencies that can be suppressed by pseudo-logarithmic averaging decreases as the length of the averaging time intervals increases and the SNR increases automatically with the transient decay.

Figure 5:
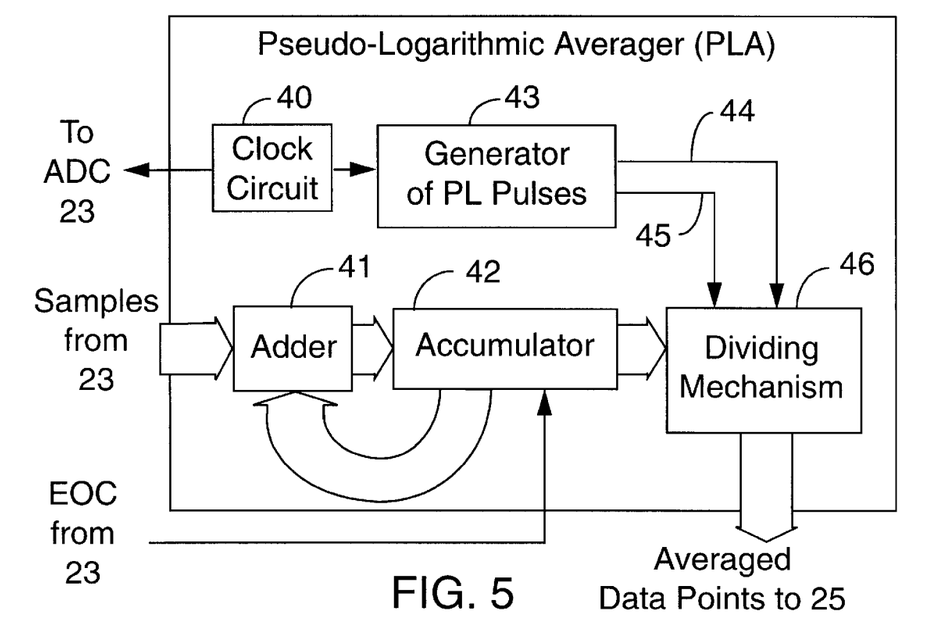
FIG. 5 is a block diagram of the pseudo-logarithmic averager.

Referring now to FIG. 5, the pseudo-logarithmic averager 24 comprises a clock circuit 40, a 24-bit adder 41, an accumulator 42, a generator of pseudo-logarithmic pulses 43, and a dividing mechanism 46.

Figure 6:
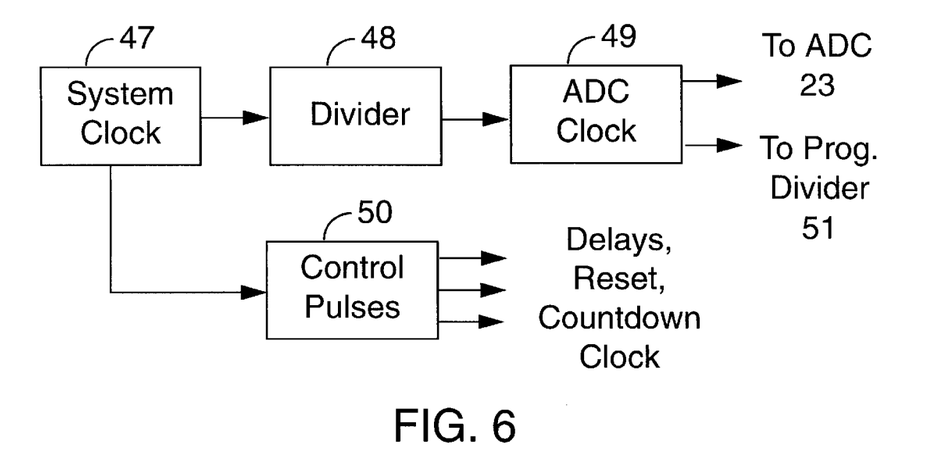
FIG. 6 is a block diagram of the clock circuit in the pseudo-logarithmic averager.

FIG. 6 is a block diagram of the clock circuit 40. A system clock 47 produces a plurality of pulses which are utilized for driving the conversion operations by the ADC and for performing logical and arithmetic operations in the pseudo-logarithmic averager 24. Control pulses for programmable delay, reset, and clock pulses for the dividing mechanism 46 are produced in the block 50 by combining the system clock signal with pulses from the generator of pseudo-logarithmic pulses 43.

In the present embodiment, the system clock frequency is 16 megahertz and a divider 48 reduces this frequency to 100 kilohertz which is utilized by the ADC clock 49 to produce a signal for initiating a digitizing operation by the ADC 23 and a signal for the programmable divider 51.

Figure 7:
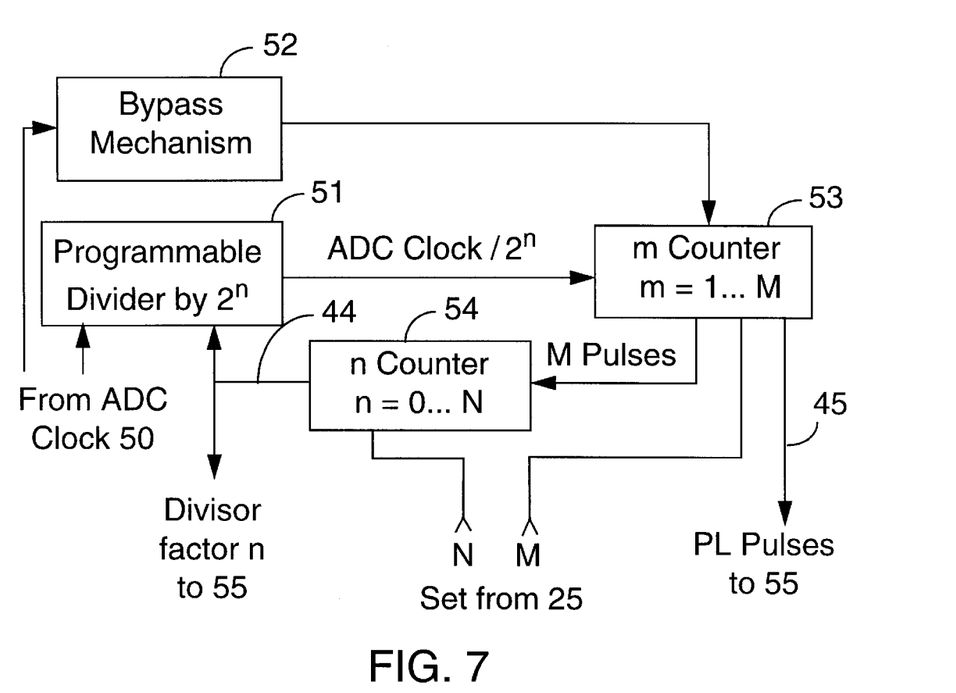
FIG. 7 is a block diagram of the generator for a pseudo-logarithmic sequence of pulses utilized for control of the pseudo-logarithmic averager.

FIG. 7 is a block diagram of the generator of pseudo-logarithmic pulses 43. The divider 51 can be programmed to divide by any number that can be presented as a power of two. In the present embodiment, the circuit of this divider utilizes programmable counters and shift-registers and the power factor n is limited in the range from one to 12. The divider 51 reduces the ADC clock frequency by division of $2^n$. A bypass mechanism 52 supplies pulses with the original ADC clock frequency for the beginning of transient data processing. The ADC pulses or the pulses produced by the divider 51 are counted by a counter 53 that can be programmed from the computer by the means of the ISA bus interface 25 as indicated in FIG. 1. The counter 53 produces a plurality of pseudo-logarithmic pulses 45 in accordance with the pseudo-logarithmic sequence of data points illustrated hereinabove in FIG. 4. In the present embodiment, this counter 53 can be set to any number M between one and 16. When the counter 53 completes counting toward M, another counter 54 increments the number n stored therein by one. This counter 54 is also programmable by the computer by means of ISA bus interface 25. In the present embodiment, the counter 54 can be set to any number N between one and 12. The number n stored in this counter 54 is the power number for the programmable divider 51 and the divisor factor for the dividing mechanism 46.

Referring now to FIG. 5, the EOC signal from ADC 23 causes the result from the digitizing operation in the ADC 23 to be added by a 24-bit adder 41 to the value stored in the accumulator 42. The accumulator 42 is reset to zero after each averaging operation from the block 50 in FIG. 6. Thereof, the accumulator contains a sum of the conversion results since the last averaging operation and subsequent reset. This sum is continuously stored in the dividing mechanism 46 at the end of each conversion.

Figure 8:
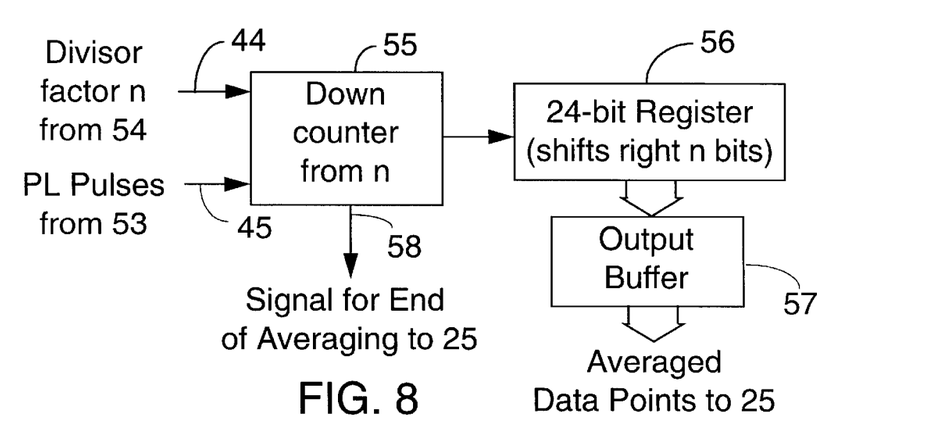
FIG. 8 is a block diagram of the dividing mechanism utilized in the pseudo-logarithmic averager.

The dividing mechanism 46 comprises a programmable down counter 55, a 24-bit shift register 56, and an output buffer 57 as indicated in FIG. 8. The down counter 55 is set to the number n by the counter 54 in FIG. 7 and receives clock pulses from the block 51 in FIG. 6. Except for the first group of pulses whereas n=0, each pseudo-logarithmic pulse received from the counter 53 in FIG. 7 triggers a dividing operation in the mechanism 46. This dividing operation consists of n steps of shift right by one bit of the sum in the 24-bit shift register 56 and these steps are counted by the down counter 55. Thereof, the sum existing at the moment of receiving of a pseudo-logarithmic pulse contains $2^n$ sampling points and is divided by $2^n$. After the down counter 54 reaches zero, the result from this division operation represents a data point and is stored in the output buffer 57. Therefrom, the data point is transferred to a specified location in the computer memory by means of the ISA bus interface circuit 25 which performs a Direct Memory Access (DMA) transfer after each averaging operation. When the counter 54 reaches the programmed number N, the acquisition of the DLTS transient and the pseudo-logarithmic averaging of the sampling points pertaining to the current DLTS transient is complete, a signal for the end of averaging operation 58 is send to the ISA bus interface circuit 25. The interface circuit 25 respond by producing a hardware interrupt signal which triggers an interrupt routine in the computer 27 for performing the aforementioned continuous time averaging over each data point.

The essence of continuous time averaging is to replace the simple summing and dividing algorithm, used heretofore in digital DLTS systems, with continuous update of the stored result with a fraction of the difference between the incoming value and the value stored by a previous update. Mathematically this is expressed as $$v_0 \Leftarrow v_0 + \frac{(v_{in} - v_0)}{T_c} \quad (1)$$

wherein $v_0$ is the value stored in a memory mechanism, $v_{in}$ is an incoming value and $T_c$ is a number representing a digital time constant. Naturally, in the first averaging operation $v_0$ is set to zero and the result is $v_0 = v_{in}/T_c$. In the preferred embodiment, continuous time averaging is performed over each data point by a computer program but an electronic circuit that performs this operation and transfers the result to a computer is easy to construct.

Heretoafter, the operation of the claimed DLTS system and determination of the trap properties is well know in the art. In the present embodiment, the temperature is varied over an advantageous interval, the data points averaged by utilizing both techniques, pseudo-logarithmic time averaging and continuous time averaging, are stored in the computer and are available for post measurement analysis utilizing the methods as disclosed in for example U.S. Pat. No. 3,859,595 to Lang, U.S. Pat. No. 5,521,839 to Doolittle et al., or as described by D. K. Schroder in Chapter 7 of the aforementioned book "Semiconductor Material and Device Characterization." Furthermore, because the obtained transient signal is essentially noise free, from its graphical representation on a logarithmic vertical versus linear horizontal axis it is possible to validate the exponential nature of the transient and to determine immediately the characteristic time constant of the DLTS transient. Depending on the settings of N and M, the number of data points is reduced to about 200 or less, and this allows heretoabove manipulation to be executed by the computer during the experiment without a visible delay.

Figure 9:
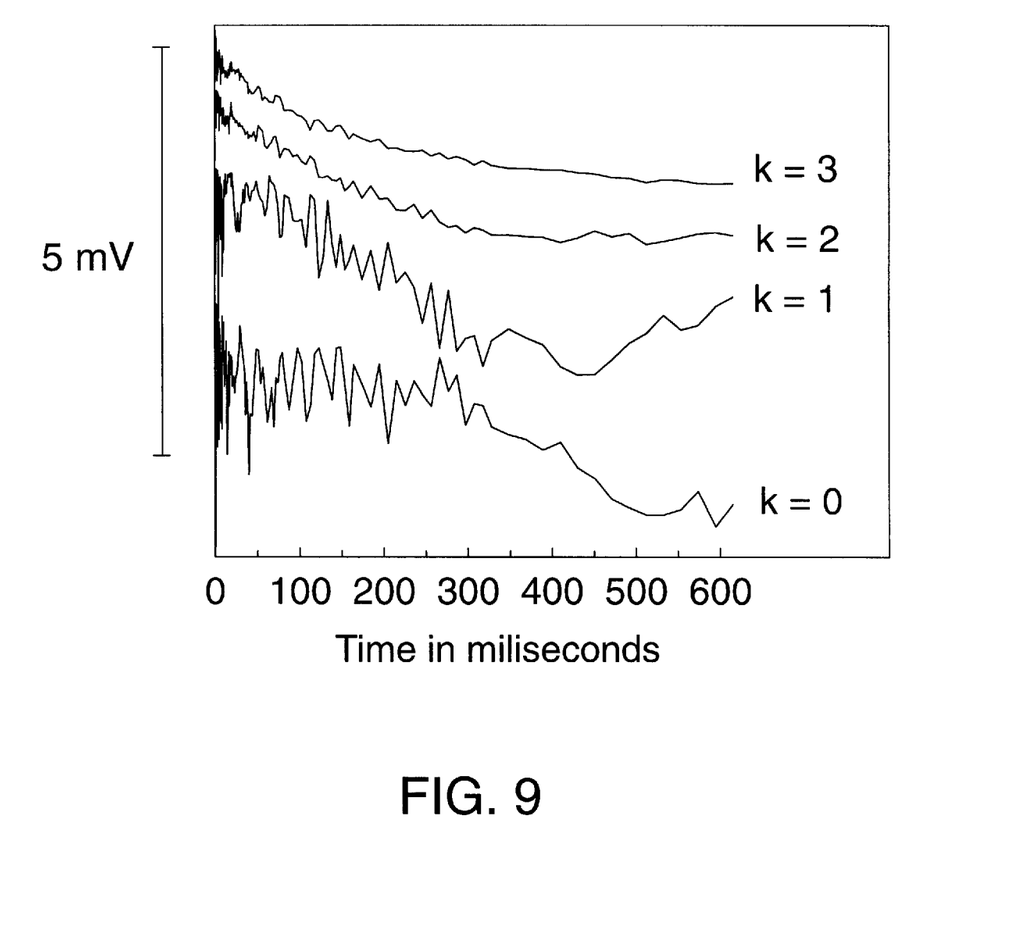
FIG. 9 shows graphics of experimentally obtained DLTS transients from a noisy signal after pseudo-logarithmic time averaging (for k=0) and after utilizing a combination of pseudo-logarithmic time averaging and continuous time averaging with a short digital time constant.
Figure 10:
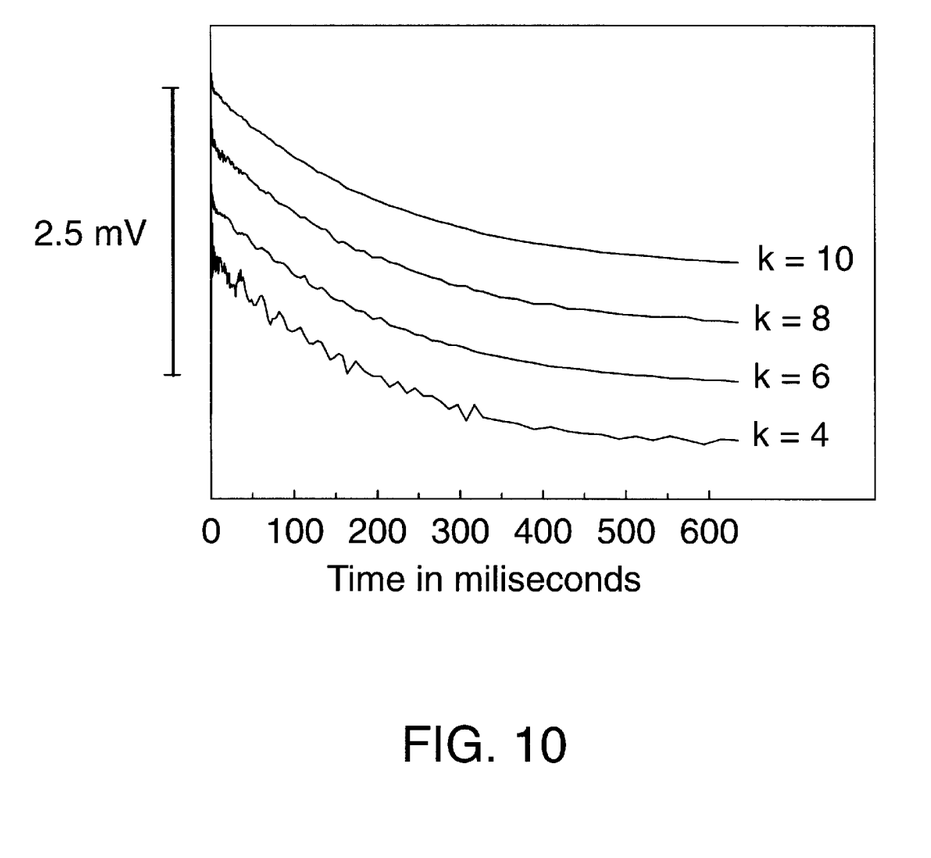
FIG. 10 shows graphics of experimentally obtained DLTS transients from a noisy signal after utilizing a combination of pseudo-logarithmic time averaging and continuous time averaging with a long digital time constant.

The importance of combined use of both averaging methods is illustrated by FIG. 9 and FIG. 10. Therein, a voltage DLTS transient obtained from numerical processing of a noisy signal is shown for different settings of the digital time constant $T_c$ which time constant is represented as two in power k. Thereof, for k=0 $T_c$ equals one and, in accordance with the expression (1) shown heretoabove, only pseudo-logarithmic time averaging is utilized. The trace indicated with k=0 in FIG. 9 proves the need to complement the pseudo-logarithmic time averaging with an additional averaging method. In U.S. Pat. No. 5,521,839 to Doolittle et al. this additional averaging method is a multiple time averaging which stands for the simple summing and dividing algorithm applied for each data point. It is known in the art of DLTS that this averaging method is disadvantageous in regard to the signal to noise ratio obtained by averaging performed by utilizing analog instruments such as boxcar averager, lock-in amplifier or exponential correlator. The best mode for retrieval of DLTS transients completely immersed in noise is to apply relatively high rate of alternating filling with emission pulses and to utilize continuous time averaging with digital time constant set to two in power k, wherein k>9. When the DLTS transient has substantially larger intensity than the noise intensity in the signal, the best mode is to reduce the aforementioned rate, to increase aforementioned numbers N and M, and to set the digital time constant to an advantageously selected number depending on the desired SNR improvement.

In another aspect of the present invention, the FET to be tested 10 can be connected in mode known as back gate mode of operation. Referring now to FIG. 1, in this mode the source and drain are connected to the conductance sensor as explained heretofore, whereas the gate terminal is connected to the voltage source 13 and the substrate is connected to the switch SW1. In another aspect of the present invention, the DC bias applied to the substrate, the source or to the drain can be varied and can be used for spatial profiling of the trap concentration. Because of the nonideality of the conductance sensor and the possibility to obtain a very low source-drain conductance of the FET 10 by applying an advantageous voltage, the feedback circuit will operate and CR-DLTS measurements can be performed even if the reference resistor 16 is disconnected and not utilized. Furthermore, the conductance sensor 14 can be replaced with a capacitance sensor and still valid DLTS measurements can be performed. In one more aspect of the present invention, the aforementioned combination of numerical averaging techniques is not limited to the present system and can be applied to a plurality of DLTS methods or in other experiments producing transient type of data. Other advantageous embodiment can store the aforementioned plurality of sampling points in the computer memory and utilize a computer program for performing the pseudo-logarithmic time averaging. It is obvious to someone skilled in the art that many variations and modifications of the heretoabove embodiment may be made without substantially departing from the matter of the present invention. Accordingly, all such variations and modification are intended to be included herein in the scope of the present invention.

Wherefore, the following is claimed:

1. A combination of numerical methods for processing of a deep level transient spectroscopy (DLTS) transient signal with continuous distribution in time and in intensity, comprising the steps of:
   a. converting said DLTS transient signal from one period in a plurality of sampling points, each one of said sampling points representing an averaged intensity of said DLTS signal in a time segment with a constant length from said DLTS signal;
   b. averaging said sampling points over time intervals, said time intervals combined in time segments, with length of said time segments increasing by the power of two;
   c. assigning the results of said averaging to a plurality of data points, each data point with a distinct time delay measured from commencement of said one period;

d. repeating steps (a) through (c) for a second period of said DLTS periodical signal;

e. subtracting each said data point from the period preceding said second period from corresponding data point with same said time delay from said second period;

f. dividing each result from said subtracting to a number, said number associated with periodicity of said DLTS periodical signal into a digital time constant of averaging;

g. summing each result from said dividing with a corresponding data point with same said time delay from said preceding period; and h. assigning each result from said summing to a corresponding data point with same said time delay from said second period.

2. The combination of numerical methods of claim 1 herein said averaging includes the steps of:

a. summing said sampling points over time intervals, said time intervals combined in time segments, with length of said time segments increasing by the power of two and each said time segment comprising equal number of said time intervals; and b. dividing said sum for each time interval by the corresponding number of said sampling points contained in said time interval.

3. An apparatus for processing of a deep level transient spectroscopy (DLTS) periodical signal with continuous distribution in time and in intensity by applying said combination of numerical methods, said combination of methods including the steps of:

a. converting said DLTS transient signal from one period in a plurality of sampling points, each one of said sampling points representing an averaged intensity of said DLTS signal in a time segment with a constant length from said DLTS signal;

b. averaging said sampling points over time intervals, said time intervals combined in time segments, with length of said time segments increasing by the power of two;

c. assigning the results of said averaging to a plurality of data points, each data point with a distinct time delay measured from commencement of said one period;

d. repeating steps (a) through (c) for a second period of said DLTS periodical signal;

e. subtracting each said data point from the period preceding said second period from corresponding data point with same said time delay from said second period;

f. dividing each result from said subtracting to a number, said number associated with periodicity of said DLTS periodical signal into a digital time constant of averaging;

g. summing each result from said dividing with a corresponding data point with same said time delay from said preceding period; and h. assigning each result from said summing to a corresponding data point with same said time delay from said second period, said apparatus comprising:
a digitizing mechanism;
an adder;
an accumulator;
a dividing mechanism;
a clock mechanism;

a generator of pulses, said pulses repeating at time intervals, said time intervals combined in time segments, with length of said time segments increasing by the power of two and each said time segment comprising equal number of said time intervals;

an interfacing mechanism for transfer of numerically processed said DLTS periodical signal in a computer memory;

an interfacing mechanism for producing an electrical signal, said electrical signal indicating completion of numerically processed said DLTS periodical signal in said computer memory;

a computer; and a computer program, said program triggered by said electrical signal; said program executing continuously steps (e) through (h) for each period of said DLTS periodical signal.

4. The apparatus of claim 3, said apparatus further comprising said generator, said generator comprising:

a bypass mechanism;

a programmable divider including programmable counters and shift registers; and programmable counters.

5. The apparatus of claim 3, said apparatus further comprising said dividing mechanism, said dividing mechanism comprising:

a programmable counter; and a programmable shift register.

6. A system for performing deep level transient spectroscopy (DLTS) analysis on a field-effect transistor (FET) built in a semiconductor material, including measurement of changes in a parameter of said FET, said parameter being a threshold or pinch-off voltage, said voltage causing a cessation of conductivity between two parts of said FET, said parts termed as a source and a drain, when said voltage is applied to a third part of said FET, said part termed as a gate, in respect to said source, or in respect to base material of said FET, said base material termed as a substrate, said system comprising:

means for periodically filling of traps localized between said source and drain of said FET with charge carriers, the traps being local defects caused by impurity atoms or disruptions in normal periodicity of crystalline structure of said material and being capable of trapping charge carriers so that a trapped charge carrier must acquire an activation energy to be freed from the trap;

means for detection of changes in said threshold or pinch-off voltage of said FET after cessation of the action of said filling said traps with charge carriers;

means for producing a control voltage, said control voltage accurately balancing said changes in said threshold or pinch-off voltage;

means for measurement of changes of said control voltage versus time and versus temperature of said FET; and means for determining an activation energy level for said traps from analysis of said changes of said control voltage.

7. The system of claim 6 further comprising a means for determining a capture cross section of a trap, said capture cross section indicating a probability that a free charge carrier in a neighborhood of said trap will be trapped in said trap.

8. The system of claim 6 further comprising a means for determining a concentration of said traps.

9. The system of claim 6 further comprising a means for determining spatial distribution of said concentration of said traps.

10. The system of claim 6 wherein said control voltage is applied to said gate.

11. The system of claim 6 wherein said control voltage is applied to said substrate.

12. The system of claim 6 wherein said means for measurement of changes of said control voltage further comprising the steps of:
   a. converting said changes of said control voltage from one period in a plurality of sampling points, each one of said sampling points representing an averaged intensity of said DLTS signal in a time segment with a constant length from said DLTS signal;
   b. averaging said sampling points over time intervals, said time intervals combined in time segments, with length of said time segments increasing by the power of two;
   c. assigning the results of said averaging to a plurality of data points, each data point with a distinct time delay measured from commencement of said one period;
   d. repeating steps (a) through (c) for a second period of said DLTS periodical signal;
   e. subtracting each said data point from the period preceding said second period from corresponding data point with same said time delay from said second period;
   f. dividing each result from said subtracting to a number, said number associated with periodicity of said changes of said control voltage into a digital time constant of averaging;
   g. summing each result from said dividing with a corresponding data point with same said time delay from said preceding period; and
   h. assigning each result from said summing to a corresponding data point with same said time delay from said second period.

13. An apparatus for carrying out a deep level transient spectroscopy (DLTS) analysis on a field-effect transistor (FET) built in a semiconductor material, including measurement of changes in a parameter of said FET, said parameter being a threshold or pinch-off voltage, said voltage causing a cessation of conductivity between two parts of said FET, said parts termed as a source and a drain, when said voltage is applied to a third part of said FET, said part termed as a gate, in respect to said source, or in respect to base material of said FET, said base material termed as a substrate, said apparatus comprising;
   an impedance sensor for detection of changes in impedance between said source and drain of said FET; and
   a feedback mechanism for applying pulses to said gate or said substrate for periodically filling traps localized between said source and drain of said FET with charge carriers and for applying a control voltage to said gate for compensation of said changes in impedance responsive to said pulses in time intervals between said pulses, the traps being local defects caused by impurity atoms or disruptions in normal periodicity of crystalline structure of said material and being capable of trapping charge carriers so that a trapped charge carrier must acquire an activation energy to be freed from the trap.

14. The apparatus of claim 13 wherein said control voltage is applied to said substrate.

15. The apparatus of claim 13 wherein impedance sensor is a conductance sensor.

16. The apparatus of claim 13 wherein impedance sensor is a capacitance sensor.

17. The apparatus of claim 13 wherein said feedback mechanism further comprising:
   an integrator circuit for substantially magnifying said changes in impedance and for preventing oscillations in said apparatus;
   means for sampling said control voltage in a time interval substantially shorter than time interval between said pulses and beginning at moment of time substantially closer to the expiration of said time interval between said pulses, said sampling without need to make adjustments when periodicity of said pulses is varied;
   means for storage of sampled part of said control voltage;
   a summing circuit for combining sampled part of said control voltage with a response of said integrator circuit to said pulses at the beginning of time interval between said pulses into said control voltage; and
   a switch for alternating connection of said gate of said FET to said pulses or to output of said summing circuit.

* * * * *